(12) United States Patent
Gotoh

(10) Patent No.: US 9,947,750 B2
(45) Date of Patent: Apr. 17, 2018

(54) SILICON CARBIDE SEMICONDUCTOR SWITCHING DEVICE AND METHOD OF MANUFACTURING SILICON CARBIDE SEMICONDUCTOR SWITCHING DEVICE

(71) Applicant: FUJI ELECTRIC CO., LTD., Kawasaki-shi, Kanagawa (JP)

(72) Inventor: Masahide Gotoh, Matsumoto (JP)

(73) Assignee: FUJI ELECTRIC CO., LTD., Kawasaki-Shi, Kanagawa (JP)

( * ) Notice: Subject to any disclaimer, the term of this patent is extended or adjusted under 35 U.S.C. 154(b) by 0 days.

(21) Appl. No.: 15/468,819

(22) Filed: Mar. 24, 2017

(65) Prior Publication Data

US 2017/0200788 A1 Jul. 13, 2017

Related U.S. Application Data

(63) Continuation of application No. PCT/JP2015/079020, filed on Oct. 14, 2015.

(30) Foreign Application Priority Data

Nov. 12, 2014 (JP) .................................. 2014-230223

(51) Int. Cl.
*H01L 29/16* (2006.01)
*H01L 29/10* (2006.01)
(Continued)

(52) U.S. Cl.
CPC ...... *H01L 29/1608* (2013.01); *H01L 29/1095* (2013.01); *H01L 29/4236* (2013.01);
(Continued)

(58) Field of Classification Search
CPC ............. H01L 29/1608; H01L 29/7827; H01L 29/4236; H01L 29/66068; H01L 29/1095; H01L 29/7813
See application file for complete search history.

(56) References Cited

U.S. PATENT DOCUMENTS 6,902,964 B2 * 6/2005 Sriram ................ H01L 29/8128
257/E29.102
2008/0102585 A1 5/2008 Nakamura et al.
(Continued)

FOREIGN PATENT DOCUMENTS

JP 2008-112824 A 5/2008
JP 2011-091283 A 5/2011
(Continued)

*Primary Examiner* — William Coleman
(74) *Attorney, Agent, or Firm* — Rabin & Berdo, P.C.

(57) ABSTRACT

A silicon carbide semiconductor switching device having a planar metal oxide semiconductor insulated gate structure. The silicon carbide semiconductor switching device includes a silicon carbide semiconductor substrate having a bandgap wider than that of silicon, a drift layer formed on the silicon carbide semiconductor substrate, a base region selectively formed in the drift layer at a top surface thereof, a source contact region selectively formed in the base region at a top surface thereof, a trench formed in the drift layer at the top surface thereof, the trench having a depth that is shallower than a depth of the source contact region, a gate electrode embedded in the trench, a top surface of the gate electrode being substantially flush with a top surface of the source contact region, and an interlayer insulating film formed on the top surfaces of the source contact region and the gate electrode.

8 Claims, 4 Drawing Sheets

(51) Int. Cl.
  *H01L 29/423*  (2006.01)
  *H01L 29/78*  (2006.01)
  *H01L 29/66*  (2006.01)

(52) U.S. Cl.
  CPC .... *H01L 29/66068* (2013.01); *H01L 29/7813* (2013.01); *H01L 29/7827* (2013.01)

(56) References Cited

U.S. PATENT DOCUMENTS

| | | |
|---|---|---|
| 2011/0095302 A1 | 4/2011 | Hikichi |
| 2012/0012861 A1 | 1/2012 | Nakano et al. |
| 2012/0228637 A1 | 9/2012 | Nakabayashi et al. |
| 2013/0043490 A1 | 2/2013 | Sorada |
| 2015/0123148 A1 | 5/2015 | Nakano et al. |
| 2015/0318389 A1 | 11/2015 | Tsuchiya et al. |

FOREIGN PATENT DOCUMENTS

| | | |
|---|---|---|
| JP | 2012-199515 A | 10/2012 |
| JP | 5059989 B1 | 10/2012 |
| JP | 2013-239489 A | 11/2013 |
| JP | 2015-32813 A | 2/2015 |
| WO | WO 2010-110246 A1 | 9/2010 |
| WO | WO-2014-103000 A1 | 7/2014 |

\* cited by examiner

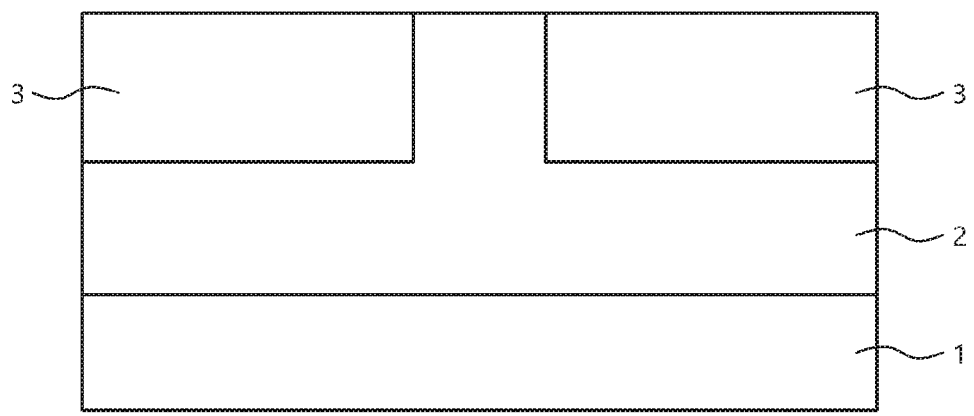
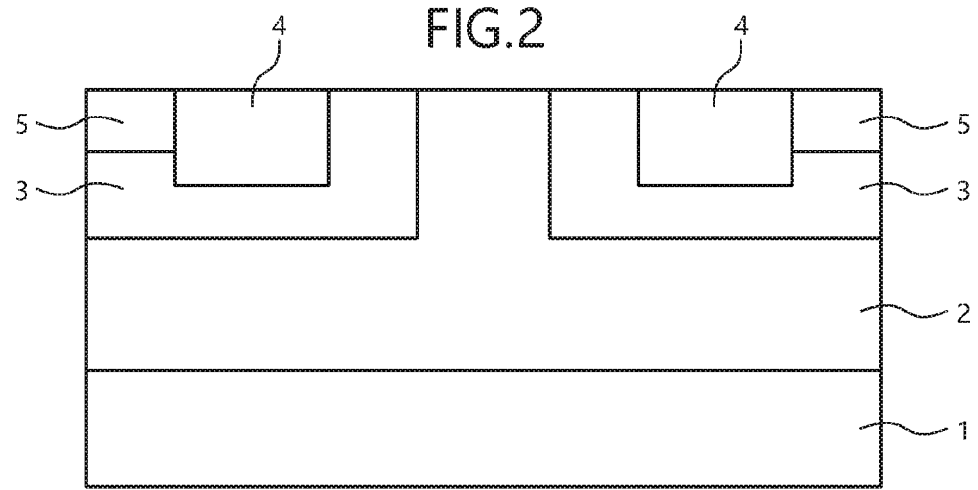

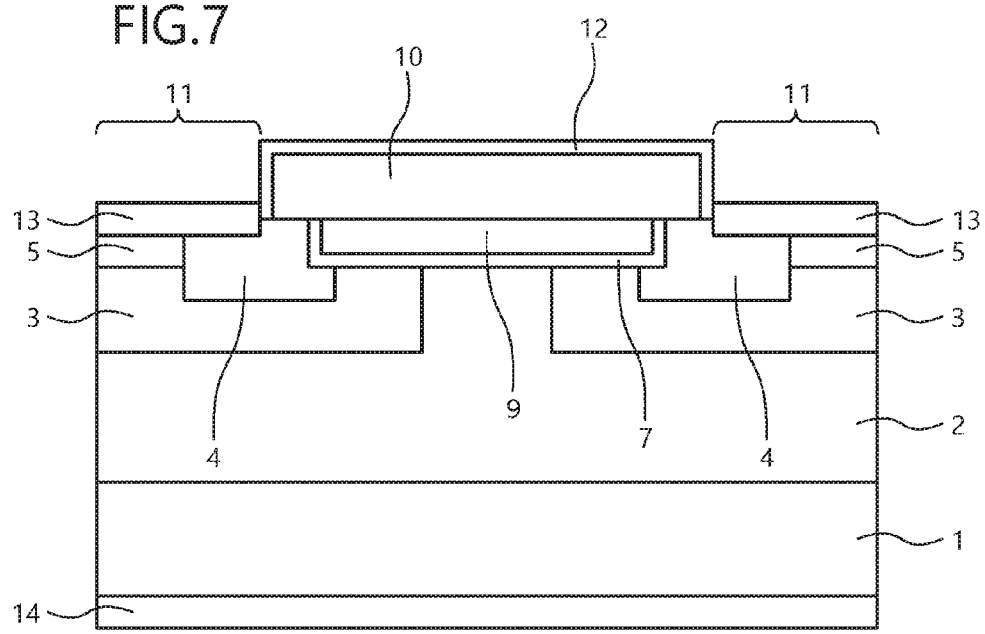
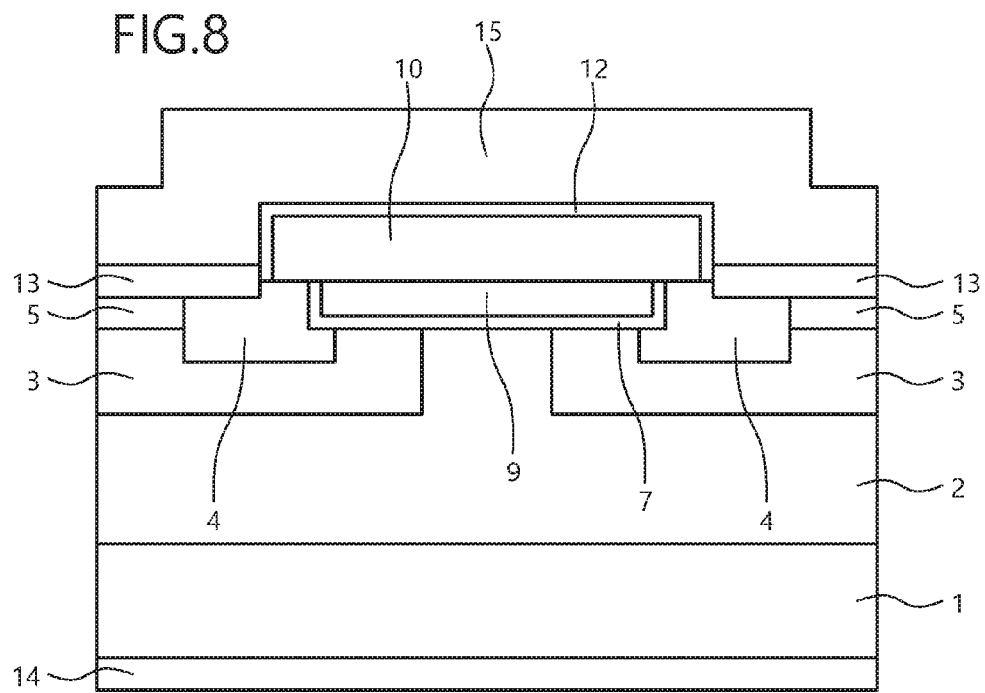

SILICON CARBIDE SEMICONDUCTOR SWITCHING DEVICE AND METHOD OF MANUFACTURING SILICON CARBIDE SEMICONDUCTOR SWITCHING DEVICE

CROSS REFERENCE TO RELATED APPLICATIONS

This is a continuation application of International Application PCT/JP2015/079020 filed on Oct. 14, 2015, which claims priority from a Japanese Patent Application No. 2014-230223 filed on Nov. 12, 2014, the contents of which are incorporated herein by reference.

BACKGROUND OF THE INVENTION

1. Field of the Invention

Embodiments of the invention relate to a single-crystal silicon carbide semiconductor switching device, and particularly relate to a silicon carbide semiconductor switching device of a surface structure of a planar metal-oxide-semiconductor field-effect transistor (MOSFET) and a method of manufacturing the silicon carbide semiconductor switching device.

2. Description of the Related Art

Single-crystal silicon carbide (SiC) has a bandgap and breakdown field strength that well exceed those of single-crystal silicon (Si), and is expected to enable realization of ultra-high voltage semiconductor switching devices exceeding a breakdown voltage of 10 kV alone or SiC devices having lower loss are expected to replace Si devices.

Metal oxide semiconductor (MOS) gate structures of MOSFETs as a silicon carbide semiconductor device are roughly divided into planar structures in which ON current flows directly under a gate electrode in a horizontal direction and trench structures in which the gate electrode is embedded in a groove (trench) formed in a silicon carbide semiconductor substrate and ON current flows along a side of the gate electrode. The planar structure does not concentrate electric field near the gate electrode and therefore, enables the breakdown voltage to be increased easily. The planar structure is suitable for quicker practical implementation because of the relatively simple structure.

However, the planar structure forms, on a flat silicon carbide substrate, a gate electrode having a certain constant thickness (typically 100 to 500 nm) and therefore, due to the unavoidable occurrence of steps caused by the gate electrode height, a problem arises in that consequent to the side wall angle (angle, etc.) of the gate electrode pattern end and the like, when the interlayer insulating film is deposited, the covering shape of the step portions overhangs, making coverage at side wall portions of the steps of the surface electrode layer (e.g., aluminum-silicon (Al—Si) film) or barrier metal (e.g., titanium nitride (TiN)) poor.

There are techniques of employing a trench structure and completely embedding the gate electrode in a gate trench to avoid the problems caused by the physical shape (for example, refer to Japanese Laid-Open Patent Publication Nos. 2011-91283 and 2012-199515, and Japanese Patent No. 5059989).

Further, as a method of resolving the overhanging of the interlayer insulating film with the planar structure as is, for example, there is a technique of using borophosphosilicate glass (BPSG) for the uppermost layer of the interlayer insulating film, performing heat treatment of several hundred degrees C. (reflow process) after formation of the film, and making the step portion a gradual incline (for example, refer to Japanese Laid-Open Patent Publication No. 2008-112824).

SUMMARY OF THE INVENTION

According to one aspect of the present invention, a silicon carbide semiconductor switching device has a planar metal oxide semiconductor insulated gate structure and is formed on a silicon carbide semiconductor substrate having a bandgap wider than that of silicon. The silicon carbide semiconductor switching device includes a trench having a depth that is shallower than a depth of a source contact region; a gate electrode formed embedded in the trench; and an interlayer insulating film covering the source contact region and the gate electrode that are level and have top surfaces that are substantially a same height.

According to another aspect of the present invention, a silicon carbide semiconductor switching device has a planar metal oxide semiconductor insulated gate structure and is formed on a silicon carbide semiconductor substrate having a bandgap wider than that of silicon. The silicon carbide semiconductor switching device includes a source contact region formed in a surface layer of the silicon carbide semiconductor substrate; a trench having a depth that is shallower than a depth of the source contact region, the trench being formed in the surface layer of the silicon carbide semiconductor substrate so that the source contact region is exposed at a side wall; the insulated gate structure constituted by a gate electrode formed in the trench via a gate oxide film; an interlayer insulating film covering the gate electrode; a contact hole penetrating the interlayer insulating film in a depth direction and exposing the source contact region; and an electrode contacting the source contact region through the contact hole. A difference of a height of a top surface of the gate electrode and a height of a top surface of the source contact region is set such that the contact hole has a width that is substantially constant from a lower end toward an upper end.

In the silicon carbide semiconductor switching device, an interface of the gate oxide film with the silicon carbide semiconductor substrate directly below the gate electrode is provided to have a height position in a range that is at least 150 nm lower than a height position of the top surface of the source contact region and at least 100 nm shallower than a height position of a bottom of the source contact region.

In the silicon carbide semiconductor switching device, the gate electrode has a width that is longer than a distance between the source contact region and an adjacent source contact region.

According to yet another aspect of the present invention, a method of manufacturing a silicon carbide semiconductor switching device having a planar metal oxide semiconductor insulated gate structure and formed on a silicon carbide semiconductor substrate having a bandgap wider than that of silicon, includes forming a trench having a depth that is shallower than a depth of a source contact region; forming a gate electrode embedded in the trench; and forming a top surface of the gate electrode and a top surface of the source contact region to be substantially a same height and level.

The method further includes performing pattern formation of the gate electrode by one of chemical-mechanical polishing and dry etching.

In the method, the source contact region is formed by ion implantation and dopant activation, and the trench is formed by dry etching from after the ion implantation of the source contact region until immediately before the dopant activation.

Objects, features, and advantages of the present invention are specifically set forth in or will become apparent from the following detailed description of the invention when read in conjunction with the accompanying drawings.

BRIEF DESCRIPTION OF THE DRAWINGS

FIGS. 1, 2, 3, 4, 5, 6, 7, and 8 are cross-sectional views depicting manufacturing processes of a silicon carbide semiconductor switching device according to an embodiment.

DETAILED DESCRIPTION OF THE INVENTION

Figure 3:
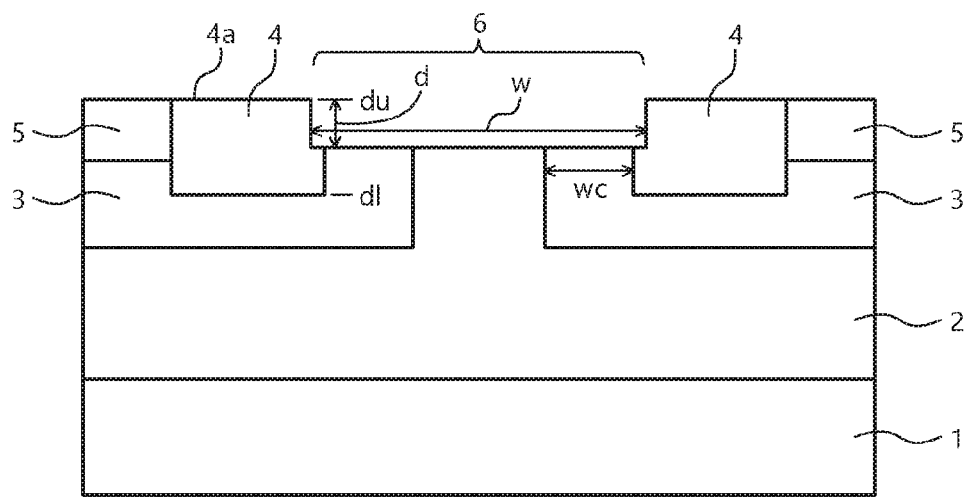

Embodiments of a silicon carbide semiconductor switching device and a method of manufacturing a silicon carbide semiconductor switching device according to the present invention will be described in detail with reference to the accompanying drawings.

In the invention hereinafter, a high-concentration doped poly-silicon (poly-Si) is used as a gate electrode material, phosphosilicate glass (PSG) having a relatively low hygroscopic property is used as an interlayer insulating film, a titanium nitride (TiN) film is used as a barrier metal, and an aluminum-silicon (Al—Si) film is used as a front electrode layer.

FIGS. 1, 2, 3, 4, 5, 6, 7, and 8 are cross-sectional views depicting manufacturing processes of the silicon carbide semiconductor switching device according to an embodiment. A surface structure formed on an n-type silicon carbide substrate will be described with reference to these drawings.

Step 1 is described. FIG. 1 depicts a state immediately after a p-type base region 3 is formed by low-concentration ion implantation after an n-type drift layer 2 is formed by epitaxial growth on a single-crystal, n-type silicon carbide (SiC) substrate 1.

As depicted in FIG. 1, on the single-crystal, n-type silicon carbide substrate (substrate) 1 having a bandgap that is wider than that of silicon and cleaned by a method such as chemical cleaning or plasma etching, the n-type drift layer 2 is formed by epitaxial growth. On the n-type drift layer 2, the p-type base region 3 is selectively formed by low-concentration ion implantation. When there are constraints on the capability of the ion implantation equipment and deep ion implantation (typically denoted as accelerating voltage of 350 keV or higher) is not possible, a combination of the above epitaxial growth and low-concentration ion implantation may divided into 2 or more steps. A method of mask pattern formation and mask alignment are obvious and therefore, description and drawings thereof are omitted.

Step 2 is described. FIG. 2 depicts a state immediately after a source contact region 4 and a p-type contact region 5 are formed by high-concentration ion implantation. As depicted in FIG. 2, the n-type source contact region 4 and the p-type contact region 5 are selectively formed in a surface layer of the p-type base region 3 by high-concentration ion implantation.

A depth of a bottom of the source contact region 4 typically has to be 400 to 600 nm with consideration of the portion lost to sacrificial oxidation and the thickness of a gate oxide film and gate electrode. On the other hand, a depth of a bottom of the p-type contact region 5 may be about 200 to 300 nm since electrical junction with the p-type base region 3 is an objective and the dopant need not be implanted as deep as the source contact region 4.

Step 3 is described. FIG. 3 depicts a state immediately after a shallow trench 6 for embedding the gate electrode is formed on a front surface side by dry etching. As depicted in FIG. 3, the trench 6 has a width w that is wider than a distance between two adjacent source contact regions 4. A channel length (a width wc of a portion of the p-type base region 3 between the source contact region 4 and the n-type drift layer 2) of the trench 6 is determined by the precision of position alignment at the time of formation of an ion implantation mask used in forming the source contact region 4 and is not affected by processing precision in a width direction of the shallow trench 6.

The trench 6 has a depth d that is at least 150 nm lower than a top surface 4a (a height position du) of the source contact region 4 and at least 100 nm shallower than a height position dl of the bottom of the source contact region 4.

As a result, the device structure itself is still a planar MOSFET. When the depth d of the trench 6 is smaller (shallower) than the above range, the thickness of the gate electrode is insufficient and thus, is not desirable. Further, when the depth d of the trench 6 is larger than the above range (deeper than the bottom dl of the source contact region 4), the channel is formed up to the trench side wall, i.e., the channel length becomes larger than designed whereby the gate threshold voltage may vary and thus, is not desirable.

The bottom of the shallow trench 6 immediately after dry etching becomes less smooth by plasma damage and in this state, channel mobility does not improve and therefore, annealing for smoothing and also serving as a dopant activation process may be performed to restore the smoothness of the surface of the bottom of the trench 6.

Figure 4:
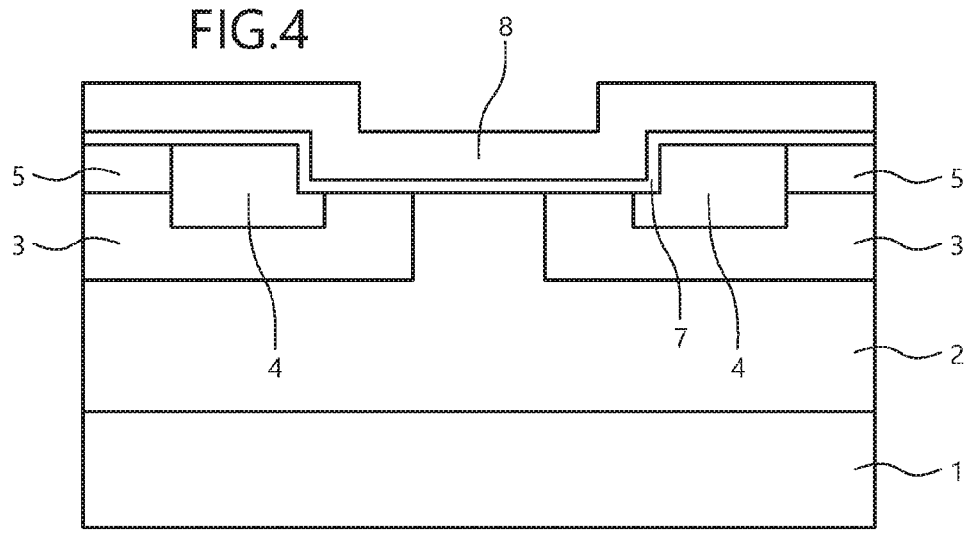

Step 4 is described. FIG. 4 depicts a state immediately after a poly-silicon film 8 is formed by low-pressure, chemical vapor deposition (CVD) after a gate oxide film 7 is formed by thermal oxidation. Although not depicted in FIG. 4, first, the entire single-crystal, n-type silicon carbide substrate 1 is cleaned by sacrificial oxide film removal using a chemical such as hydrofluoric acid and a sacrificial oxide.

Thereafter, for example, on the entire front surface side of a base (single-crystal n-type silicon carbide substrate (substrate) 1 and the n-type drift layer 2), the gate oxide film 7 is formed by thermal oxidation. On the gate oxide film 7, for example, the poly-silicon film 8 doped at a high concentration is formed as gate electrode material by a low-pressure CVD method. The gate oxide film 7 may have a thickness of 50 to 100 nm and the poly-silicon film 8 may have a thickness of 300 to 500 nm with consideration of film thickness controllability of poly-silicon and the gate threshold voltage that is typically used in a power device.

Figure 5:
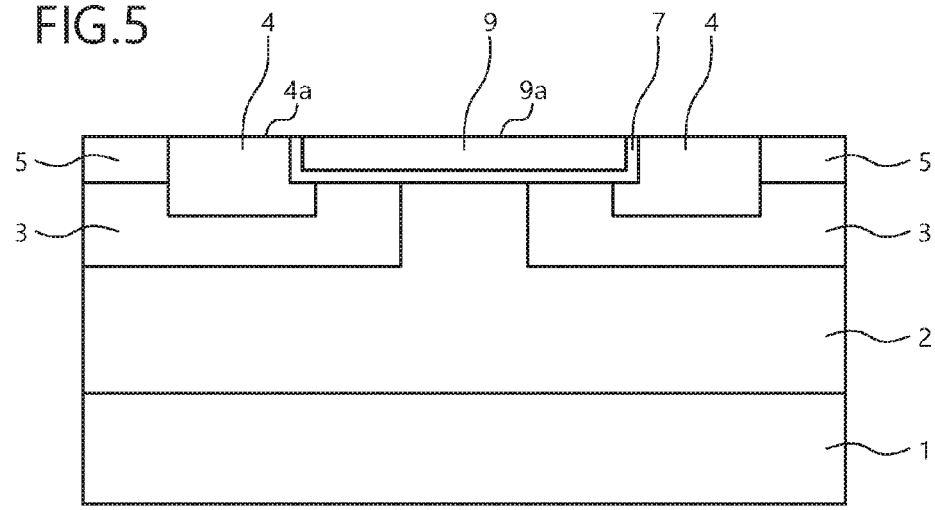

Step 5 is described. FIG. 5 depicts a state immediately after pattern formation of a gate electrode 9 after processing of the poly-silicon film 8 by chemical-mechanical polishing or dry etching. Here, processing is performed such that a height of a top surface 9a of the gate electrode 9 and a height of the top surface 4a of the source contact region 4 have no difference and are substantially level (within 200 nm). As a result, a source contact hole 11 described hereinafter has a width that may be made substantially constant from a lower end toward an upper end.

As a processing means of the poly-silicon film 8, chemical-mechanical polishing easily affords higher selectivity with respect to the poly-silicon film 8 (the side wall of the shallow trench 6, i.e., the base acts, as a strong stopper), enabling the gate electrode 9 to be formed in a self-aligning manner and therefore, may be used.

For example, when a photoresist is used as a mask (not depicted) and the difference of the heights the top surface 9a of the gate electrode 9 and the top surface 4a of the source contact region 4 may be processed to be within 200 nm by existing dry etching equipment, dedicated chemical-mechanical polishing equipment need not be separately prepared and thus, dry etching may be used.

When the difference of the heights the top surface 9a of the gate electrode 9 and the top surface 4a of the source contact region 4 is 200 nm or more, an interlayer insulating film 10 (refer to FIG. 6) overhangs consequent to the side wall angle of the gate electrode 9 and thus, is not desirable.

Figure 6:
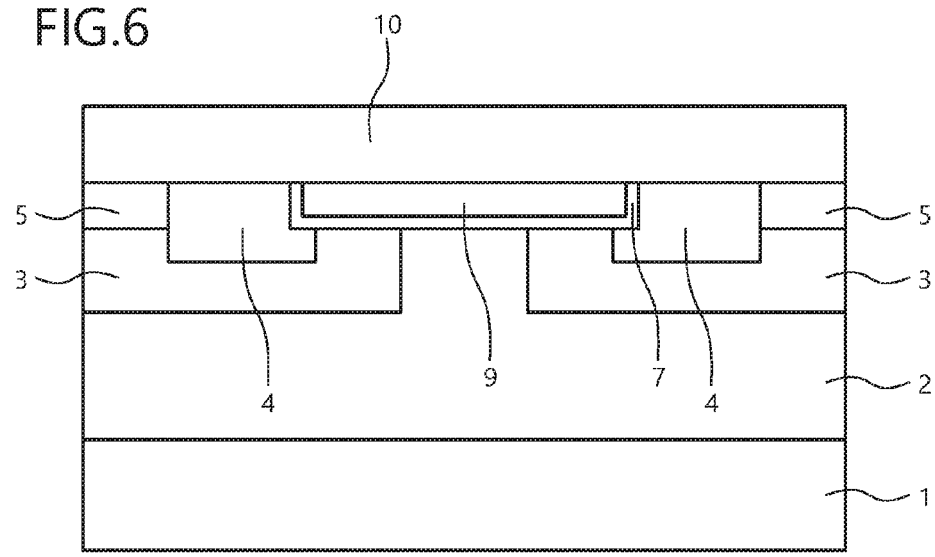

Step 6 is described. FIG. 6 depicts a state immediately after the gate electrode 9 is completely embedded after the interlayer insulating film 10 is formed by ambient pressure CVD. As depicted in FIG. 6, a PSG film is deposited on the entire front surface side of the base by ambient pressure CVD whereby the interlayer insulating film 10 is formed. At step 5, since the difference of the heights of the top surfaces of the gate electrode 9 and of the source contact region 4 is suppressed within 200 nm, the problem of overhanging that occurs with conventional planar structures does not occur. In particular, when pattern formation of the gate electrode 9 is performed by chemical-mechanical polishing, it becomes possible to achieve nearly complete levelness.

Step 7 is described. FIG. 7 depicts a state immediately after ohmic electrodes 13, 14 are formed on a rear surface side of the substrate 1 and on a contact hole bottom after the source contact hole 11 is formed by dry etching and a surface of the interlayer insulating film 10 is protected by a TiN film. For example, a photoresist is used as a mask (not depicted) and the source contact hole 11 is formed by dry etching. Next, for example, the TiN film is formed by sputtering and the surface of the interlayer insulating film 10 is protected by a barrier metal layer 12. Further, the bottom of the source contact hole 11 is again opened by dry etching to expose the silicon carbide (the p-type contact region 5 and the source contact region 4).

The silicon carbide (the p-type contact region 5 and the source contact region 4) exposed at the bottom of the source contact hole 11, for example, and a metal that easily forms an ohmic junction with silicon carbide such as Ni are reacted, forming the ohmic electrodes 13 on the front surface side of the substrate. In the formation of the ohmic junction, a common method such as thermal annealing may be used.

In the case of a vertical device, although the ohmic electrode 14 also has to be formed on the rear surface side, to simplify the process, the ohmic electrode 14 may be formed at the same time as the ohmic electrode 13.

Step 8 is described. FIG. 8 depicts a state immediately after an Al—Si deposition layer is formed as a front electrode layer 15. After a contact hole (not depicted) for ensuring an electrical junction with the gate electrode 9 is formed, for example, the Al—Si film is formed by sputtering, forming the front electrode layer 15. As a means of patterning for the front electrode layer 15, a photoresist may be used as a mask (not depicted) and, for example, wet etching by phosphoric acid, nitric acid, and acetic acid may be applied.

As described, in the present invention, before a dopant activation process is performed, the silicon carbide (the drift layer 2) of a region directly below the position of the gate electrode 9 is pre-dug by dry etching to a depth that is shallower than the position of the bottom d1 of the source contact region 4 and the gate electrode 9 is embedded in the substrate 1. Further, the difference of the heights of the top surface 4a of the high-concentration ion implantation region (the source contact region 4) and of the top surface 9a of the gate electrode 9 is suppressed to less than 200 nm. As a result, the device structure remains planar while the occurrence of overhanging of the interlayer insulating film 10 may be suppressed.

In contrast, with a conventional planar structure as is, a step is formed between the gate electrode 9 and the silicon carbide layer (base) whereby the covering shape of the step portion overhangs when the interlayer insulating film 10 is deposited, making coverage at the side wall portions of the steps of the barrier metal layer (e.g., the TiN film) 12 and the front electrode layer (e.g., the Al—Si film) 15 poor. Thus, compared to a conventional planar structure, the coverage the barrier metal layer 12 and the front electrode layer 15 may be greatly improved.

Furthermore, adoption of a trench MOSFET structure (structure in which the gate electrode is completely embedded in a gate trench) is not necessary to solve the problem caused by the physical shape of the planar structure. In the structure of the present invention, attention is drawn near the gate electrode 9, the element structure itself is a planar MOSFET as is and therefore, the need for a measure that considers electrical problems (reduction of ON resistance, mitigation of electric field concentration at the trench bottom, and the like) peculiar to trench structures may be eliminated.

In the embodiments, although a case where a silicon carbide epitaxial substrate (base) in which a silicon carbide epitaxial layer is deposited on a silicon carbide substrate is described as an example, without limitation hereto, for example, all regions constituting the device may be ion implanted regions formed in the silicon carbide substrate.

The invention described above is similarly implemented even when the conductivity (n-type, p-type) of the semiconductor layers or semiconductor regions, and the semiconductor substrate are reversed.

However, the trench MOSFETs according to Japanese Laid-Open Patent Publication Nos. 2011-91283 and 2012-199515 and Japanese Patent No. 5059989 have separate electrical issues such as the interface state density of the gate channel of the trench side wall being high compared to planar types and reduction of the ON resistance being difficult or electric field concentrating at the gate trench bottom whereby a structure to mitigate this has to be added and thus, the concerned trench MOSFETs are not easily implemented for practical use.

Further, the BPSG in Japanese Laid-Open Patent Publication No. 2008-112824 has a hygroscopic property that is extremely high and therefore, as long as an opening of a surface electrode pattern is not covered by another protective film, it is possible that moisture in the air will be again taken in while processing at the next step is awaited, adversely affecting the reliability of the device.

According to the configuration above, before a dopant activation process is performed, the silicon carbide of the region directly below the position of the gate electrode is pre-dug by dry etching to a depth that is shallower than the positon of the bottom of the source contact region and the gate electrode is embedded in the substrate. Further, the height of the top surface of the source contact region and the height of the top surface of the gate electrode may be made substantially level such that there is no difference in height. As a result, the device structure may suppress the occurrence of overhang of the interlayer insulating film with the planar structure as is.

According to the present invention, overhanging of the interlayer insulating film may be resolved.

As described, the silicon carbide semiconductor switching device and the method of manufacturing a silicon carbide semiconductor switching device according to the present invention are useful for, for example, semiconductor devices used in power converting equipment and power supply devices such as in various industrial machines and are particularly, suitable for high-voltage silicon carbide semiconductor switching devices using a wide bandgap semiconductor material.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A silicon carbide semiconductor switching device having a planar metal oxide semiconductor insulated gate structure, comprising:
    a silicon carbide semiconductor substrate having a bandgap wider than that of silicon;
    a drift layer formed on the silicon carbide semiconductor substrate;
    a base region selectively formed in the drift layer at a top surface thereof;
    a source contact region selectively formed in the base region at a top surface thereof, the source contact region having a top surface and a bottom surface opposite to each other;
    a trench formed in the drift layer at the top surface thereof to expose the base region and the source contact region, the trench having a depth that is smaller than a distance between the top and bottom surfaces of the source contact region;
    a gate electrode embedded in the trench, a top surface of the gate electrode being substantially flush with the top surface of the source contact region; and
    an interlayer insulating film formed on the top surface of the source contact region and the top surface of the gate electrode.

2. The silicon carbide semiconductor switching device according to claim 1, wherein
    the source contact region includes at least two separate portions, and
    the gate electrode has a width that is longer than a distance between two adjacent portions of the source contact region.

3. A silicon carbide semiconductor switching device having a planar metal oxide semiconductor insulated gate structure, comprising:
    a silicon carbide semiconductor substrate having a bandgap wider than that of silicon;
    a drift layer formed on the silicon carbide semiconductor substrate;
    a base region selectively formed in the drift layer at a top surface thereof;
    a source contact region selectively formed in the base region at a top surface thereof, the source contact region having a top surface and a bottom surface opposite to each other;
    a trench formed in the drift layer at the top surface thereof, the trench having a depth that is smaller than a distance between the top and bottom surfaces of the source contact region, the source contact region being exposed at a side wall of the trench;
    a gate electrode formed in the trench, with a gate oxide film disposed between the gate electrode and the trench;
    an interlayer insulating film formed on the gate electrode;
    a contact hole penetrating the interlayer insulating film in a depth direction thereof and exposing the source contact region; and
    an electrode contacting the source contact region through the contact hole, wherein
    a top surface of the gate electrode is substantially flush with the top surface of the source contact region.

4. The silicon carbide semiconductor switching device according to claim 3, wherein
    a bottom surface of the trench is at least 150 nm lower than the top surface of the source contact region and at least 100 nm higher than the bottom surface of the source contact region.

5. The silicon carbide semiconductor switching device according to claim 3, wherein
    the source contact region includes at least two separate portions, and
    the gate electrode has a width that is longer than a distance between two adjacent portions of the source contact region.

6. A method of manufacturing a silicon carbide semiconductor switching device having a planar metal oxide semiconductor insulated gate structure, comprising:
    providing a silicon carbide semiconductor substrate having a bandgap wider than that of silicon;
    forming a drift layer on the silicon carbide semiconductor substrate;
    selectively forming a base region in the drift layer at a top surface thereof;
    selectively forming a source contact region in the base region at a top surface thereof, the source contact region having a top surface and a bottom surface opposite to each other;
    forming a trench in the drift layer at the top surface thereof to expose the base region and the source contact region, the trench having a depth that is smaller than a distance between the top and bottom surfaces of the source contact region; and
    forming a gate electrode in the trench, a top surface of the gate electrode being substantially flush with the top surface of the source contact region.

7. The method according to claim 6, wherein the forming the gate electrode includes performing pattern formation on the gate electrode by one of chemical-mechanical polishing and dry etching.

8. The method according to claim 6, wherein
    selectively forming the source contact region includes forming the source contact region by ion implantation and dopant activation, and
    forming the trench includes forming the trench by dry etching after the ion implantation of the source contact region and before the dopant activation.

* * * * *